United States Patent [19]

Abbott et al.

[11] Patent Number: 5,561,320
[45] Date of Patent: Oct. 1, 1996

[54] SILVER SPOT/PALLADIUM PLATE LEAD FRAME FINISH

[75] Inventors: Donald C. Abbott, Norton; Robert M. Fritzsche, Attleboro Falls, both of Mass.

[73] Assignee: Texas Instruments Incorporated, Dallas, Tex.

[21] Appl. No.: 329,024

[22] Filed: Oct. 25, 1994

Related U.S. Application Data

[62] Division of Ser. No. 893,911, Jun. 4, 1992, Pat. No. 5,384,155.

[51] Int. Cl.⁶ .............. H01L 23/48; H01L 23/50
[52] U.S. Cl. .............. 257/677; 257/762; 257/666
[58] Field of Search .................. 257/666, 672, 257/677, 736, 762

[56] References Cited

U.S. PATENT DOCUMENTS

| | | | |
|---|---|---|---|
| Re. 34,227 | 4/1993 | Asher et al. | 204/146 |
| 4,800,178 | 1/1989 | Mathew et al. | 437/206 |
| 4,968,397 | 11/1990 | Asher et al. | 204/146 |
| 5,138,431 | 8/1992 | Huang et al. | 257/678 |
| 5,146,312 | 9/1992 | Lim | 257/676 |
| 5,362,370 | 11/1994 | van der Heijden | 204/141.5 |
| 5,384,204 | 1/1995 | Yumoto et al. | 257/677 |

FOREIGN PATENT DOCUMENTS

| | | | |
|---|---|---|---|
| 0335608 | 10/1989 | European Pat. Off. | 257/677 |
| 0219952 | 12/1984 | Japan | 257/1984 |
| 0296255 | 12/1988 | Japan | 257/677 |
| 0305551 | 12/1989 | Japan | 257/677 |
| 0185060 | 7/1990 | Japan | 257/677 |
| 0137552 | 5/1992 | Japan | 257/677 |

*Primary Examiner*—Robert P. Limanek
*Assistant Examiner*—Alexander Oscar Williams
*Attorney, Agent, or Firm*—Mark E. Courtney; Wade James Brady, III; Richard L. Donaldson

[57] ABSTRACT

A lead frame is plated with palladium and then selected portions of the lead frame leads are spot plated with silver to improve solderability.

6 Claims, 2 Drawing Sheets

SILVER SPOT/PALLADIUM PLATE LEAD FRAME FINISH

This is a division of application Ser. No. 07/893,911, filed Jun. 4, 1992, now U.S. Pat. No. 5,384,155.

FIELD OF THE INVENTION

This invention relates to semiconductor devices, and more particularly to spot plating selected parts of a lead frame to improve bonding.

BACKGROUND OF THE INVENTION

Certain assembly operation schemes for integrated circuits require low processing temperatures which may limit the ability to bond to the standard palladium finish. Similarly, certain lead frame designs mandated by finish device requirements, limit the amount of heat that can be applied to a lead frame in the bonding operation, or restrict the ability to clamp and immobilize the lead fingers during the bond operation. Lead on chip is an example of this type of lead frame design.

SUMMARY OF THE INVENTION

The invention is a method of spot plating silver on palladium for the parts of the lead frame that are internal to the plastic package holding a semiconductor device. A spot of silver is plated in the mount and/or bond areas of a lead frame. The entire lead frame is first plated with palladium/nickel finish prior to spot silver plating.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
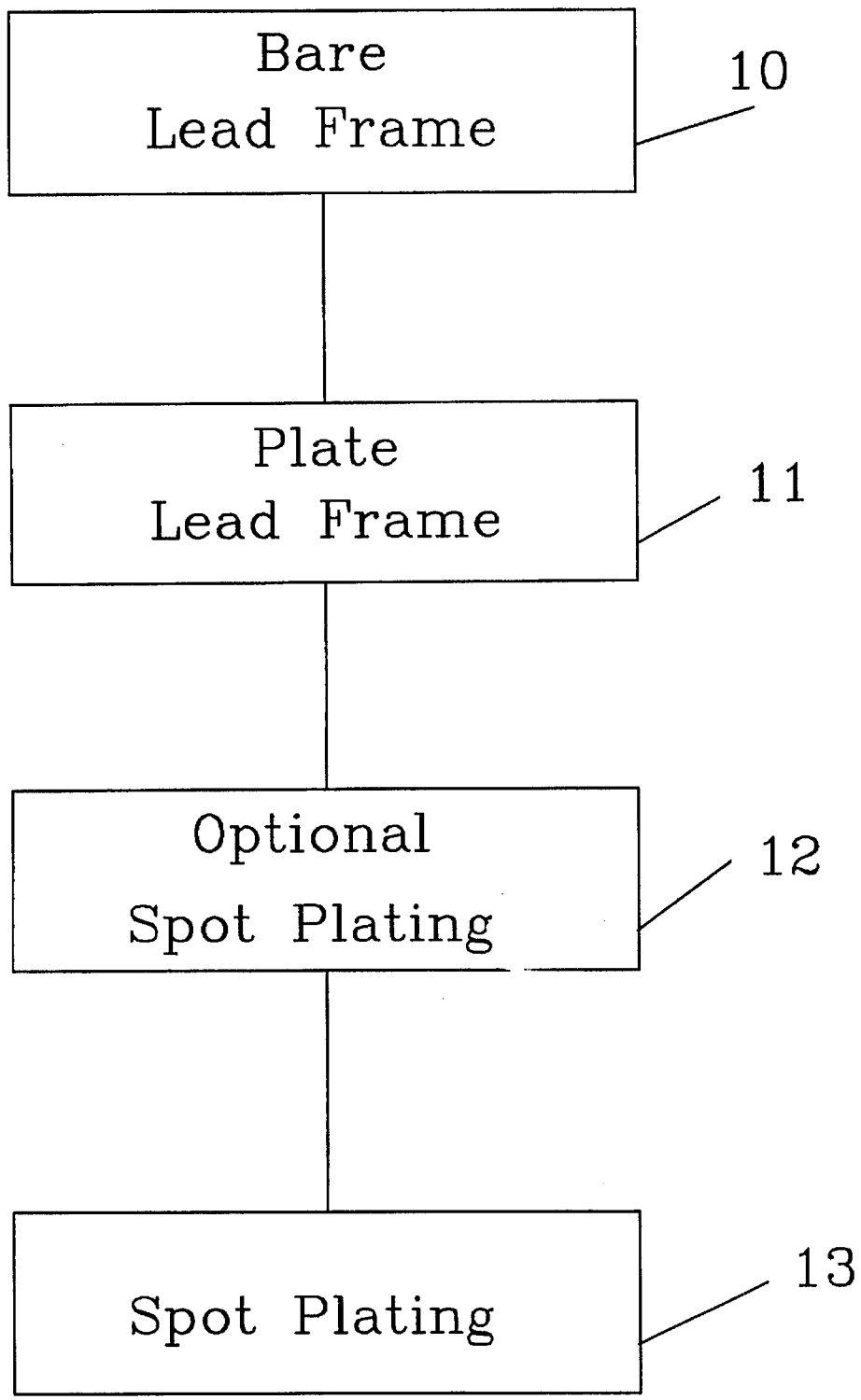
FIG. 1 is a flow diagram of the process of the present invention.

FIG. 1 is a flow diagram of the present invention. A lead frame, step 10, for example, of copper alloy, alloy 42 or other base metal is plated (step 11) with a palladium finish or a similar palladium-nickel or palladium strike or flash, nickel plate, or thin palladium plate.

An optional layer of copper or another metal is applied at selected places on the lead frame (step 12).

After the previous plating steps, a layer of silver, or another metal, is applied to selected spots on the lead frame to improve wire bondability of gold wire to the lead frame. The gold, or other metal, wire is bonded to the silver spots. Metals other than silver may be used.

The silver over palladium or palladium alloy provides improved package integrity. The amount of silver required may be reduced when silver is spot plated over palladium rather than a base metal.

Figure 2:
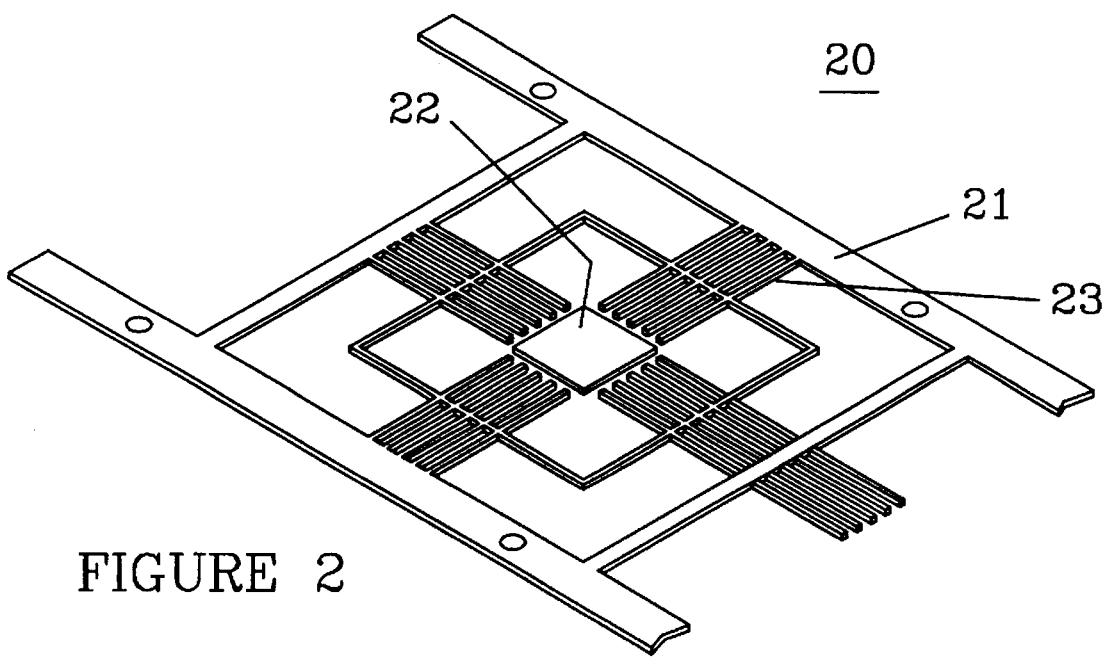
FIG. 2 illustrates a typical semiconductor lead frame.

FIG. 2 is a typical semiconductor lead frame 20 having a device mounting pad 22, leads 23 on a continuous lead frame strip 21.

Figure 3:
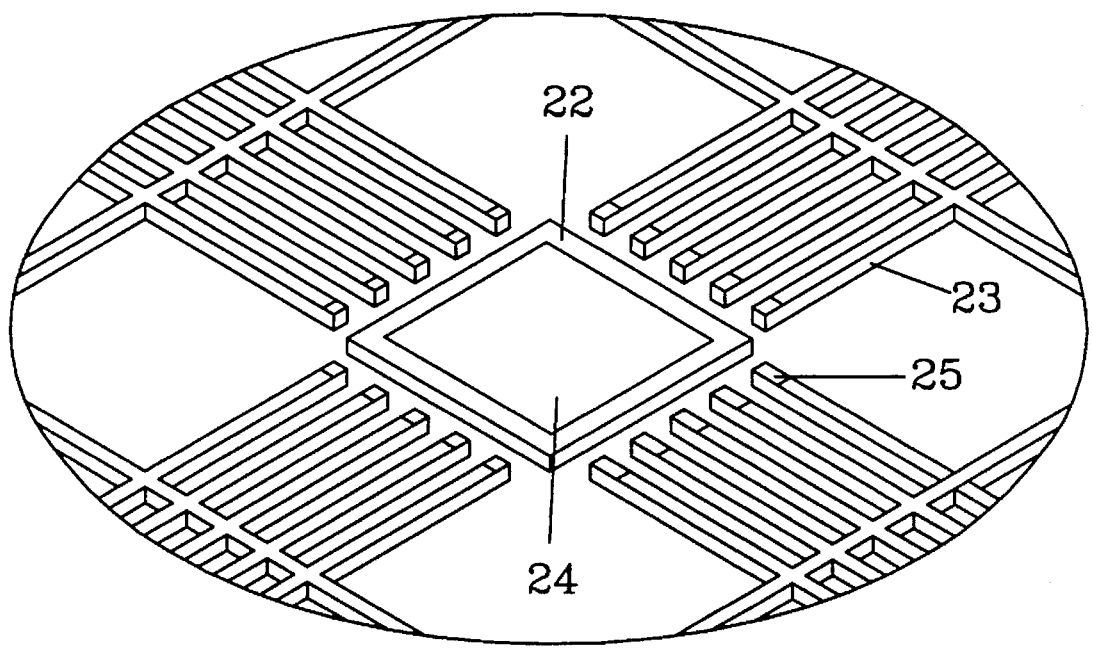
FIG. 3 is an enlarged portion of the lead frame of FIG. 2 showing the spot plating.

FIG. 3 is an enlarged portion of FIG. 2, illustrating the device mounting pad 22 and leads 23. A portion of the mounting pad 22 has a layer of silver 24 thereon. Also leads 23 each have a layer of silver plating 25 on the end of each lead. This facilitates attaching a gold bond wire to the tip of each lead and to a bond pad on a device (not illustrated) that will be mounted on the mounting pad.

What is claimed is:

1. A lead frame for a semiconductor device including a device mounting pad and lead frame leads, said lead frame comprising;

a layer of first metal selected from the group consisting of palladium and palladium-nickel plated on said lead frame;

a spot plating of silver on selected portions of said lead frame leads; and a plating of copper between said first metal plated on said lead frame and said spot plating of silver.

2. The lead frame of claim 1, wherein said layer of first metal comprises palladium.

3. The lead frame of claim 1, wherein said layer of first metal comprises a layer of palladium nickel alloy.

4. The lead frame of claim 1, wherein the selected portions of said lead frame leads include the ends of said lead frame leads which are to be attached to a semiconductor device.

5. A lead frame for a semiconductor device including a device mounting pad and lead frame leads, comprising:

a layer of palladium over a lead frame substrate;

a spot plating of silver placed over selected portions of said lead frame leads, said selected portions being within the plastic package after encapsulation; and a plating of copper placed between said layer of palladium and said spot plating of silver at said selected portions of said lead frame leads.

6. The lead frame of claim 5, wherein said layer of palladium comprises a layer of nickel-palladium alloy.

* * * * *